(12) United States Patent
Saji (10) Patent No.: US 10,819,308 B2
(45) Date of Patent: Oct. 27, 2020

(54) ELASTIC WAVE DEVICE, HIGH-FREQUENCY FRONT-END CIRCUIT, AND COMMUNICATION APPARATUS

(71) Applicant: Murata Manufacturing Co., Ltd., Nagaokakyo-shi, Kyoto-fu (JP)

(72) Inventor: Mari Saji, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 255 days.

(21) Appl. No.: 16/159,787

(22) Filed: Oct. 15, 2018

(65) Prior Publication Data

US 2019/0149126 A1    May 16, 2019

(30) Foreign Application Priority Data

Nov. 14, 2017   (JP) .................. 2017-218823

(51) Int. Cl.
| | | |
|---|---|---|
| H03H 9/145 | (2006.01) | |
| H03H 9/64 | (2006.01) | |
| H03H 9/02 | (2006.01) | |
| H04B 1/04 | (2006.01) | |
| H01L 41/047 | (2006.01) | |
| H04B 1/18 | (2006.01) | |

(52) U.S. Cl.
CPC ..... H03H 9/14541 (2013.01); H01L 41/0477 (2013.01); H03H 9/02559 (2013.01); H03H 9/02834 (2013.01); H03H 9/6406 (2013.01); H03H 9/6423 (2013.01); H04B 1/0458 (2013.01); H04B 1/18 (2013.01)

(58) Field of Classification Search
CPC ........... H03H 9/02543; H03H 9/02559; H03H 9/02834; H03H 9/02944; H03H 9/14541; H03H 9/25; H03H 9/6406; H03H 9/6423; H03H 9/6489; H03H 9/70; H03H 9/72; H03H 9/74; H03H 9/76; H04B 1/0458; H04B 2001/0408; H01L 41/0477; H01L 41/1873
USPC ..... 333/193, 195, 133; 310/313 A, 363, 364
See application file for complete search history.

(56) References Cited

U.S. PATENT DOCUMENTS

| | | | | |
|---|---|---|---|---|
| 4,978,879 | A | * | 12/1990 | Satoh ................. H03H 9/02559 310/313 A |
| 7,345,409 | B2 | * | 3/2008 | Leidl .................. H03H 9/02897 310/313 A |

(Continued)

FOREIGN PATENT DOCUMENTS

WO   2011/158445 A1   12/2011

OTHER PUBLICATIONS

J.Y. KIm et al.; "Passivation Layer Effects on Power Durability of SAW Duplexer"; 1999 IEEE Ultrasonics Symposium, pp. 39-42. (Year: 1999).*

*Primary Examiner* — Barbara Summons
(74) *Attorney, Agent, or Firm* — Keating & Bennett, LLP (57) ABSTRACT

An elastic wave device includes a piezoelectric substrate made of lithium niobate, an interdigital transducer electrode on the piezoelectric substrate, and a silicon oxide layer that covers the interdigital transducer electrode. The interdigital transducer electrode includes an AlCu layer and a metal layer disposed closer to the piezoelectric substrate than the AlCu layer, the metal layer having a higher density than the silicon oxide layer. The AlCu layer has a Cu concentration of about 13% or more by weight.

18 Claims, 7 Drawing Sheets

(56) References Cited

U.S. PATENT DOCUMENTS

| | | | |
|---|---|---|---|
| 7,467,447 B2* | 12/2008 | Nakano | H03H 3/08 |
| | | | 204/192.11 |
| 2013/0026881 A1 | 1/2013 | Okamoto et al. | |
| 2016/0037640 A1* | 2/2016 | Takai | H01L 23/3107 |
| | | | 361/753 |
| 2016/0056789 A1* | 2/2016 | Otsubo | H03H 3/02 |
| | | | 310/364 |

* cited by examiner

ELASTIC WAVE DEVICE, HIGH-FREQUENCY FRONT-END CIRCUIT, AND COMMUNICATION APPARATUS

CROSS REFERENCE TO RELATED APPLICATIONS

This application claims the benefit of priority to Japanese Patent Application No. 2017-218823 filed on Nov. 14, 2017. The entire contents of this application are hereby incorporated herein by reference.

BACKGROUND OF THE INVENTION

1. Field of the Invention

The present invention relates to an elastic wave device including a piezoelectric substrate made of lithium niobate, a high-frequency front-end circuit including the elastic wave device, and a communication apparatus.

2. Description of the Related Art

International Publication No. WO2011/158445 discloses an elastic wave device including a piezoelectric substrate made of lithium niobate. The elastic wave device includes a piezoelectric substrate, an interdigital transducer electrode on the piezoelectric substrate, and a compensation layer that covers the interdigital transducer electrode, the compensation layer being made of silicon oxide and configured to compensate for frequency-temperature characteristics. The interdigital transducer electrode has a structure in which a Mo layer and an Al layer are stacked, the Mo layer having a higher acoustic impedance than silicon oxide and being configured to enhance reflectance for an elastic wave, the Al layer being configured to reduce the electrical resistance of the interdigital transducer electrode. The Al layer may contain Cu.

Elastic wave devices are required to have higher band width ratios and improved temperature characteristics.

In such a structure, in which the interdigital transducer electrode and the silicon oxide layer that protects the interdigital transducer electrode are stacked on the piezoelectric substrate made of lithium niobate, a higher band width ratio results in the deterioration of frequency-temperature characteristics. An improvement in frequency-temperature characteristics results in the decrease of the band width ratio. That is, there is a trade-off relationship between the improvement of the band width ratio and the improvement of the frequency-temperature characteristics.

SUMMARY OF THE INVENTION

Preferred embodiments of the present invention provide elastic wave devices each having an improved band width ratio and improved frequency-temperature characteristics, high-frequency front-end circuits including the elastic wave devices, and communication apparatuses.

According to a preferred embodiment of the present invention, an elastic wave device includes a piezoelectric substrate made of lithium niobate, an interdigital transducer electrode on the piezoelectric substrate, and a silicon oxide layer on the piezoelectric substrate, the silicon oxide layer covering the interdigital transducer, in which the interdigital transducer electrode includes an AlCu layer and a metal layer disposed closer to the piezoelectric substrate than the AlCu layer, the metal layer having a higher density than the silicon oxide layer, and in which the AlCu layer has a Cu concentration of about 13% by weight or more.

In an elastic wave device according to a preferred embodiment of the present invention, the AlCu layer preferably has a Cu concentration of about 37% by weight or less. In this case, the electrical resistance of the interdigital transducer electrode is able to be effectively reduced.

In an elastic wave device according to a preferred embodiment of the present invention, a Rayleigh wave is preferably used. In this case, both of the band width ratio and the frequency-temperature characteristics are able to be effectively improved.

In an elastic wave device according to a preferred embodiment of the present invention, the metal layer having a higher density than the silicon oxide layer is preferably made of one metal selected from the group consisting of Mo, Cu, Ag, and Au. In this case, the use of the metal layer in combination with the AlCu layer sufficiently reduces the electrical resistance of the interdigital transducer electrode.

According to a preferred embodiment of the present invention, a high-frequency front-end circuit includes an elastic wave device according to a preferred embodiment of the present invention and a power amplifier.

According to a preferred embodiment of the present invention, a communication apparatus includes a high-frequency front-end circuit according to a preferred embodiment of the present invention and an RF signal processing circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described below with reference to the attached drawings so as to clarify the present invention.

Preferred embodiments described herein are illustrative. It should be noted that partial replacement and combination of configurations in different preferred embodiments may be made.

Figure 1A:
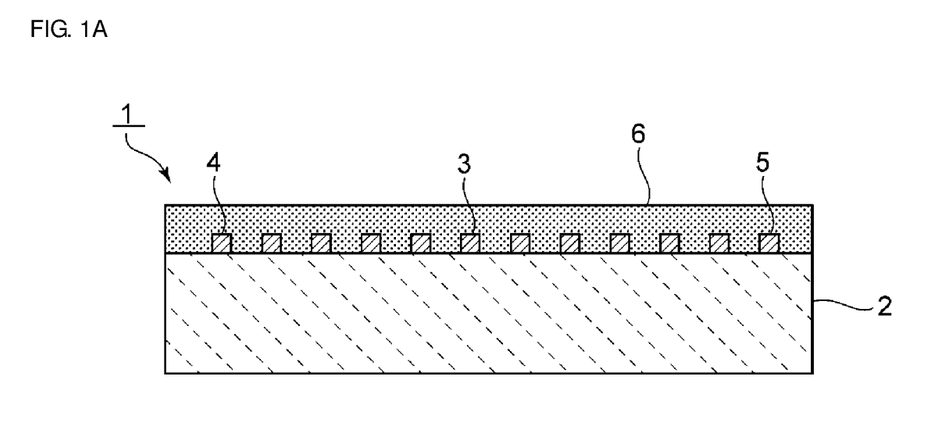
FIG. 1A is an elevational cross-sectional view of an elastic wave device according to a first preferred embodiment of the present invention.
Figure 1B:
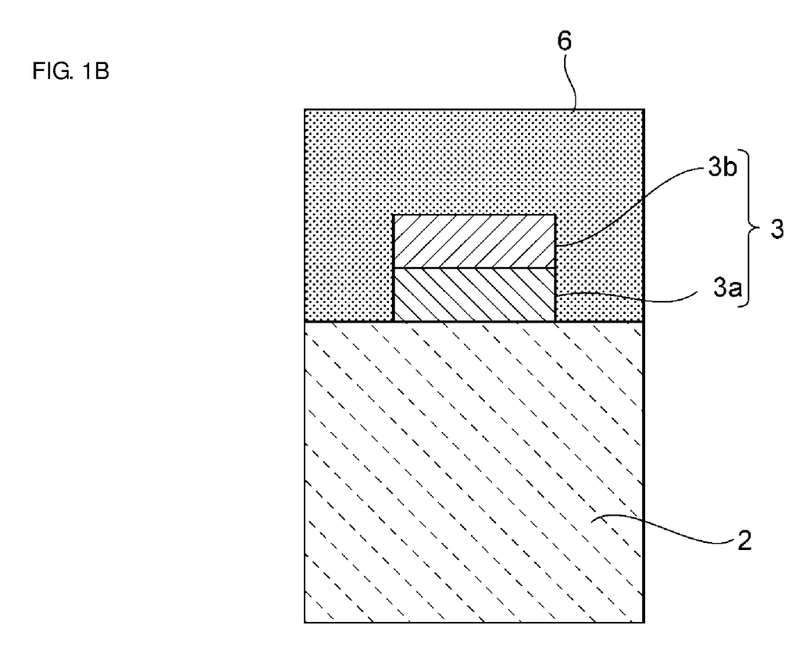
FIG. 1B is an enlarged fragmentary elevational cross-sectional view illustrating a stacked electrode structure.

FIG. 1A is an elevational cross-sectional view of an elastic wave device according to a first preferred embodiment of the present invention. FIG. 1B is an enlarged fragmentary elevational cross-sectional view illustrating a stacked electrode structure.

An elastic wave device 1 includes a piezoelectric substrate 2 preferably made of lithium niobate, for example. The elastic wave device 1 preferably uses a Rayleigh wave, for example. An interdigital transducer electrode 3 and reflectors 4 and 5 are disposed on the piezoelectric substrate 2, thus providing a one-port elastic wave resonator. A silicon oxide layer 6 is stacked and covers the interdigital transducer electrode 3. The interdigital transducer electrode 3 preferably includes, for example, an AlCu layer 3b made of Cu-doped Al and a metal layer 3a arranged closer to the piezoelectric substrate 2 than the AlCu layer 3b. The metal layer 3a is preferably made of, for example, a metal, such as gold or molybdenum, having a higher density than silicon oxide.

In the elastic wave device 1 including the piezoelectric substrate 2 made of lithium niobate, the interdigital transducer electrode 3 disposed on the piezoelectric substrate 2, and the silicon oxide layer 6 that covers the interdigital transducer electrode 3, the AlCu layer in the interdigital transducer electrode 3 preferably has a Cu concentration of, for example, about 13% by weight or more. Thus, both of the band width ratio and the temperature characteristics such as TCF and TCV are able to be improved.

This will be described in detail below. TCF refers to the temperature coefficient of resonant frequency and indicates the rate of change of resonant frequency with a change in temperature. TCV refers to the temperature coefficient of acoustic velocity and indicates the rate of change of acoustic velocity with a change in temperature. Smaller absolute values of TCF and TCV are preferred because of smaller changes in frequency and acoustic velocity. TCV indicates the temperature dependence of acoustic velocity. Thus, the deterioration of TCV correlates with the deterioration of TCF. An improvement in TCV results in an improvement in TCF.

In a structure in which an interdigital transducer electrode and a silicon oxide layer are stacked on a piezoelectric substrate made of lithium niobate in the related art, problems arise in that an increase in the band width ratio decreases TCV and that an improvement in TCV decreases the band width ratio, in some cases. The reason for this is that while a reduction in the absolute value of TCV requires an increase in the thickness of the silicon oxide layer, an increase in the thickness of the silicon oxide layer decreases the band width ratio because of mass addition.

The interdigital transducer electrode of the elastic wave device is preferably made of Al or a metal material mainly including Al, for example. Al and the metal material mainly including Al have low electrical resistance and, thus, are suitably used for the interdigital transducer electrode. The density of Al is not high. Thus, advantageously, frequency variations are not easily increased. Al has a relatively high corrosion resistance and is easily produced. The use of Al provides high electric power handling capability.

However, the inventor of preferred embodiments of the present invention has discovered that when the interdigital transducer electrode is made of a metal layer including aluminum (Al), the trade-off changes, depending on the thickness of the Al layer.

Figure 6:
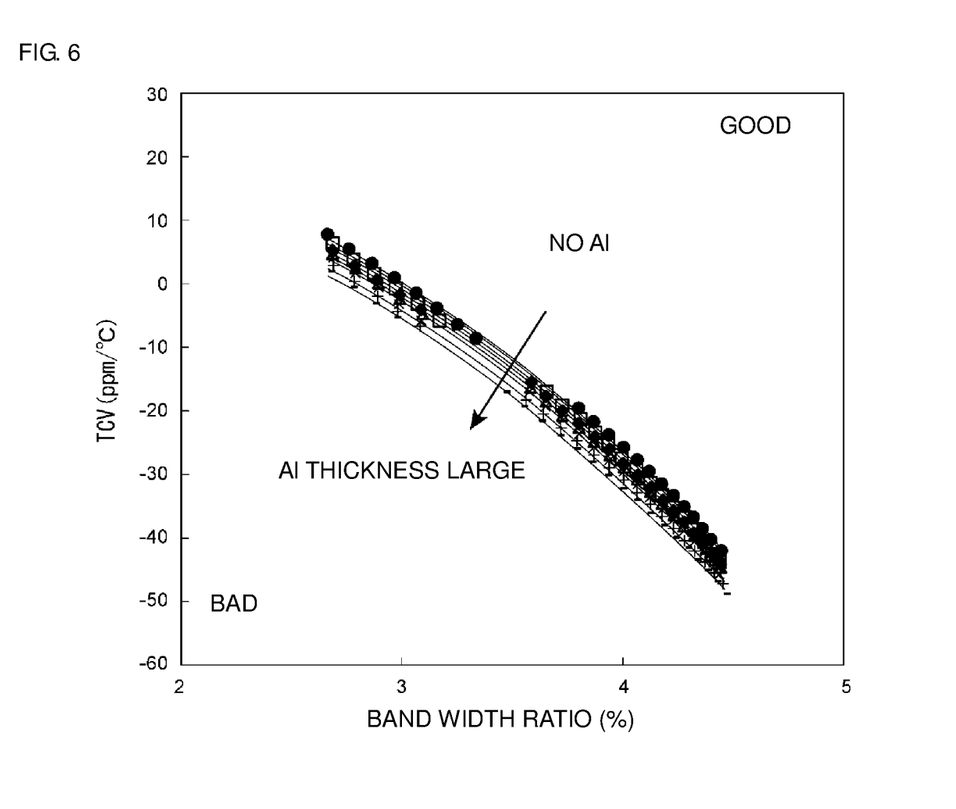
FIG. 6 illustrates the relationships among the film thickness of an Al layer in an interdigital transducer electrode, the band width ratio (%), and the temperature coefficient of acoustic velocity (hereinafter, abbreviated as "TCV") (ppm/° C.).

FIG. 6 illustrates the relationships among the film thickness of the Al layer, the band width ratio (%), and TCV (ppm/° C.). Specifically, FIG. 6 illustrates the measurement results of the relationship between the band width ratio and TCV in a structure in which a metal layer made of molybdenum and an Al layer are stacked on a piezoelectric substrate made of lithium niobate.

FIG. 6 clearly indicates that there is a trade-off relationship between the band width ratio and TCV. That is, an increase in band width ratio decreases TCV. An improvement in TCV decreases the band width ratio. An increase in the film thickness of the Al layer allows a trade-off line to shift from a good state toward a bad state as indicated by an arrow in FIG. 6. The inventor of preferred embodiments of the present invention first discovered that the increase in the film thickness of the Al layer decreases TCV at a constant band width ratio.

The inventor of preferred embodiments of the present invention has conducted intensive studies and has discovered that, in an elastic wave device including the piezoelectric substrate 2 made of lithium niobate, the interdigital transducer electrode 3 disposed on the piezoelectric substrate 2, and the silicon oxide layer 6 that covers the interdigital transducer electrode 3, the foregoing problems are solved by using Cu-doped Al, i.e., AlCu, as a material of the interdigital transducer electrode and allowing an AlCu layer to have a Cu concentration of about 13% or more by weight. Thus, the trade-off relationship between the band width ratio and the temperature characteristics, such as TCF and TCV, are able to be improved.

In the case in which an Al-containing metal material such as AlCu is used, the interdigital transducer electrode has the advantages that frequency variations are not easily increased, it has relatively high corrosion resistance, and it is easily produced.

Figure 2:
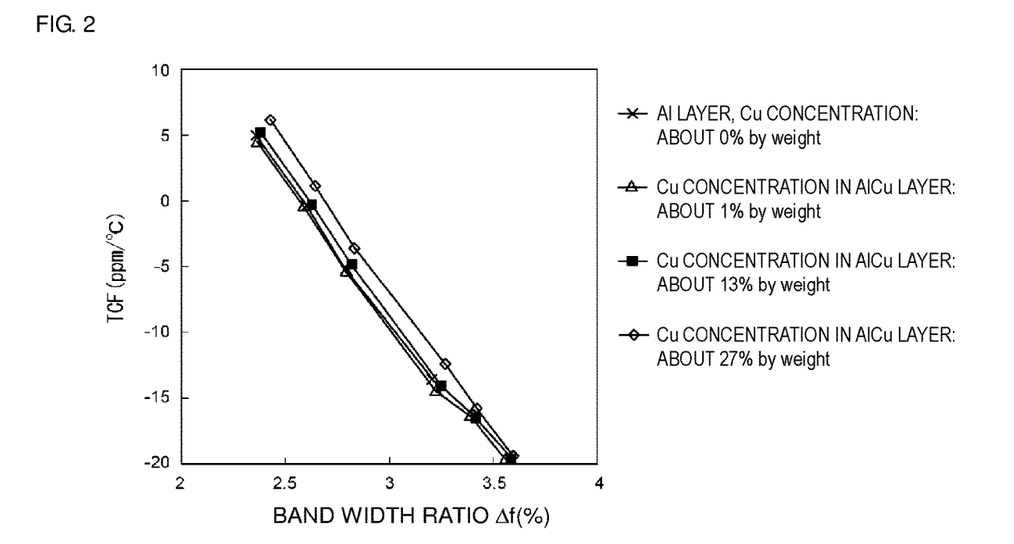
FIG. 2 illustrates the relationships among a Cu concentration (% by weight) in an AlCu layer, the band width ratio $\Delta f$ (%), and the temperature coefficient of resonant frequency (hereinafter, abbreviated as "TCF") (ppm/° C.).

FIG. 2 illustrates the relationships among a Cu concentration (% by weight) in an AlCu layer, the band width ratio Δf (%), and TCF (ppm/° C.).

The elastic wave device 1 preferably uses a Rayleigh wave, for example. A rotated Y-cut X-propagation lithium niobate substrate was used as the piezoelectric substrate 2. Euler angles are about (0°, 37.5°, 0°), for example. The interdigital transducer electrode included an Al layer or AlCu layer stacked on the metal layer 3a made of a Mo layer having a thickness of about 168 nm. The Al layer or AlCu layer had a film thickness of about 200 nm. FIG. 2 illustrates the results at a Cu concentration of about 0% by weight, i.e., the case in which the Al layer is stacked, a Cu concentration of about 1% by weight, about 13% by weight, or about 27% by weight. The silicon oxide layer had a film thickness of about 1,110 nm to about 1,650 nm.

FIG. 2 clearly indicates that the results at a Cu concentration of about 1% by weight are substantially the same as those at a Cu concentration of about 0% by weight, i.e., in the case of the Al layer. In contrast, when the Cu concentration is about 13% by weight or about 27% by weight in the AlCu layer, TCF is improved when the same band width ratio is obtained. That is, the absolute value of TCF approaches zero or about zero when the same band width ratio is obtained.

Figure 3:
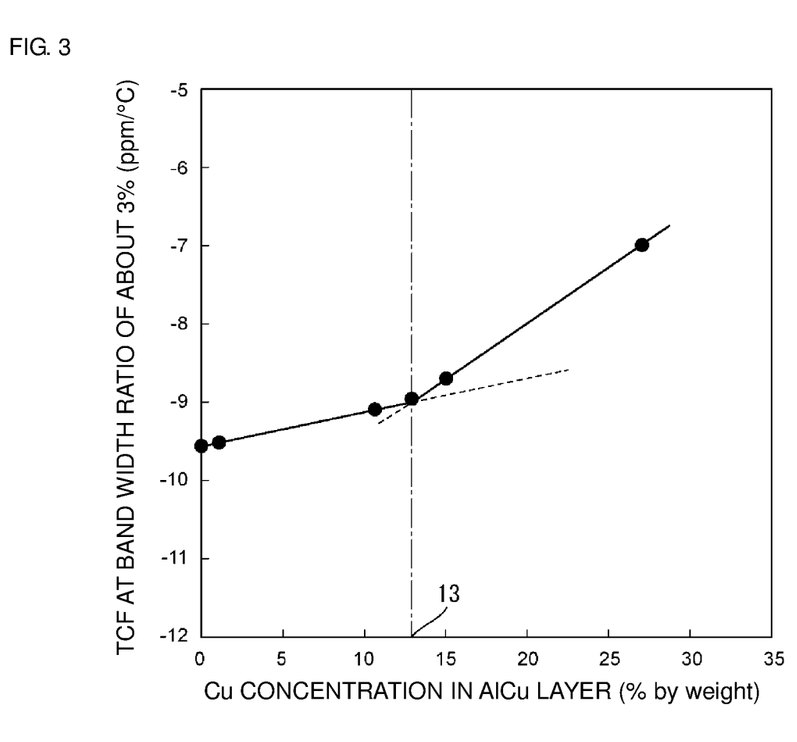
FIG. 3 illustrates the relationship between the Cu concentration (% by weight) in the AlCu layer and TCF (ppm/° C.) at a band width ratio of about 3%.

Similarly, the trade-off relationship was determined at different Cu concentrations in the AlCu layer. TCF at a band width ratio of about 3% was determined on the resulting trade-off line. FIG. 3 illustrates the relationship between the Cu concentration in the AlCu layer and TCF determined as described above at a band width ratio of about 3%. FIG. 3 clearly indicates that at a Cu concentration of about 13% by weight or more in the AlCu layer, TCF is sharply improved as the Cu concentration increases, as compared to the case of a Cu concentration of less than about 13% by weight.

Accordingly, at a Cu concentration of about 13% by weight or more, the trade-off relationship is effectively improved. Thus, both of the band width ratio and TCF is able to be improved.

In FIGS. 2 and 3, TCF has been described as a temperature characteristic. Naturally, when TCF is improved such that the absolute value of TCF is reduced, TCV is also improved in such a manner that the absolute value of TCV is reduced.

Figure 4:
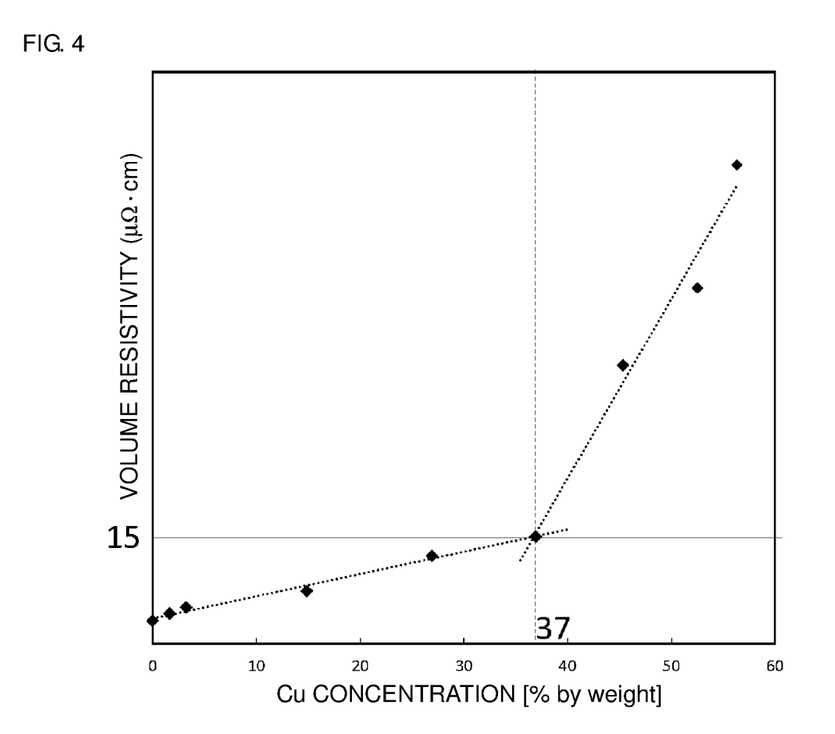
FIG. 4 illustrates the relationship between the Cu concentration (% by weight) in the AlCu layer and the volume resistivity ($\mu\Omega\cdot$cm).

FIG. 4 illustrates the relationship between the Cu concentration (% by weight) in the AlCu layer and the volume resistivity ($\mu\Omega \cdot cm$). FIG. 4 clearly indicates that at a Cu concentration of more than about 37% by weight, the volume resistivity increases sharply as the Cu concentration increases, as compared to the case of a Cu concentration of about 37% by weight or less. Higher volume resistivity results in higher electrical resistance of the interdigital transducer electrode. Thus, the Cu concentration is preferably about 37% by weight or less. At a Cu concentration of about 37% by weight or less, the interdigital transducer electrode having low electrical resistance is provided.

FIG. 4 clearly indicates that the volume resistivity is about 15 $\mu\Omega \cdot cm$ at a Cu concentration of about 37% by weight. To reduce the electrical resistance, the film thickness of the AlCu layer needs to be increased. In the case of a volume resistivity of about 15 $\mu\Omega \cdot cm$, the film thickness of the AlCu layer needs to be increased by about 100 nm in order to achieve the same or substantially the same electrical resistance. However, as described above, an increase in the film thickness of the Al layer or the AlCu layer having a Cu concentration of less than about 13% by weight degrades the trade-off relationship between the band width ratio and the temperature characteristics. Accordingly, an increase in the film thickness of the AlCu layer is not preferable.

To deal with these problems, according to preferred embodiments of the present invention, one metal material selected from the group consisting of molybdenum (Mo), copper (Cu), silver (Ag), and gold (Au) is preferably used for the metal layer 3a having a higher density than the silicon oxide layer. To ensure high reflectance for an elastic wave, the metal is used for the high-density metal layer 3a. Furthermore, the metal has low electrical resistance, thus reducing the total electrical resistance of the interdigital transducer electrode.

Table 1 presents the relationships among the volume resistivity of various high-density metals, the film thickness of the high-density metal layer such that the interdigital transducer electrode has a resistance of about 200 m$\Omega$/sq when an AlCu layer (thickness: about 200 nm) having a volume resistivity of about 15 $\mu\Omega \cdot cm$ is stacked thereon, and shear horizontal (SH) wave spurious responses.

TABLE 1

| | Volume resistivity [$\mu\Omega \cdot cm$] | Film thickness such that interdigital transducer electrode has resistance of about 200 m$\Omega$/sq when AlCu layer with thickness of about 200 nm and volume resistivity of about 15 $\mu\Omega \cdot cm$ is stacked thereon ($\lambda$ = 4 $\mu$m) | SH-wave spurious response |
|---|---|---|---|
| Au | about 2.2 | about 80.4 | good |
| Pt | about 10.4 | about 381.2 | poor |
| W | about 5.29 | about 194 | poor |
| Ta | about 13.1 | about 480 | poor |
| Mo | about 5.6 | about 205.2 | good |
| Ag | about 1.62 | about 59.2 | good |
| Cu | about 1.72 | about 62.8 | good |

As is clear from Table 1, for example, Pt has a volume resistivity of about 10.4 $\mu\Omega \cdot cm$. In the case in which the AlCu layer (thickness: about 200 nm) having a volume resistivity of about 15 $\mu\Omega \cdot cm$ is stacked on a Pt layer, the film thickness of the Pt layer has a film thickness of about 381.2 nm when the interdigital transducer electrode has a resistance of about 200 m$\Omega$/sq. In this case, the SH-wave spurious response is problematic.

Similarly, for example, in the cases of W and Ta, the SH-wave spurious responses are problematic. Specifically, in the case in which Pt, W, or Ta is used for the metal layer 3a having a higher density than the silicon oxide layer, the band width ratio of the SH-spurious response is disadvantageously increased, in some cases.

In the case in which Au, Mo, Ag, or Cu is used for the metal layer 3a having a higher density than the silicon oxide layer, there is no problem of the SH-wave spurious response. The reason for these will be described below.

Figure 5:
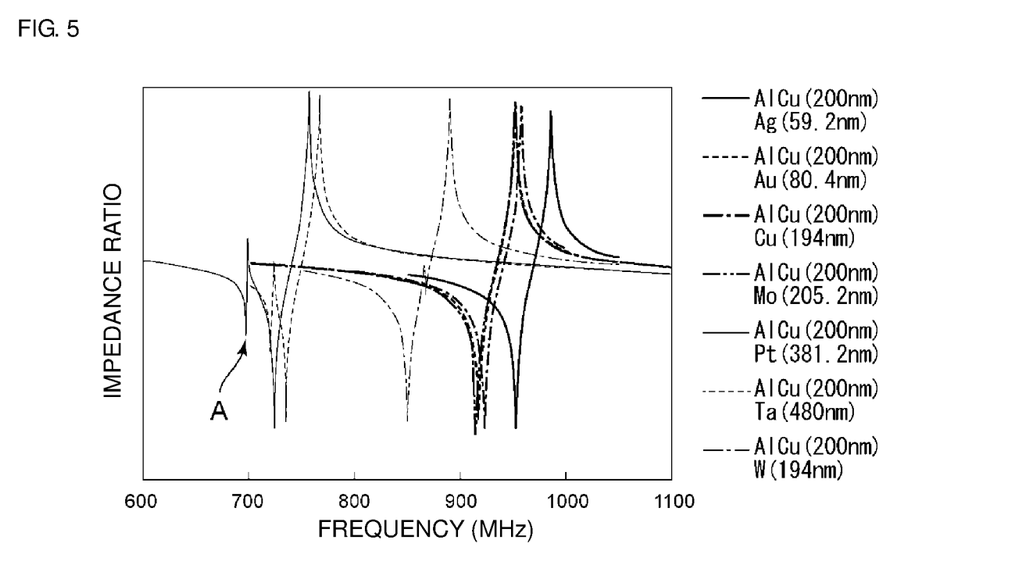
FIG. 5 illustrates impedance characteristics of elastic wave devices each including a structure in which an AlCu layer and one of various metal layers having a higher density than a silicon oxide layer are stacked.

FIG. 5 illustrates impedance characteristics of elastic wave devices each including a structure in which the AlCu layer having a volume resistivity of about 15 $\mu\Omega \cdot cm$ and a film thickness of about 200 nm is stacked on the metal layer made of platinum (Pt), tungsten (W), tantalum (Ta), Au, Cu, Ag, or Mo as a metal material having a higher density than the silicon oxide layer.

As is clear from FIG. 5, in the case of using a Pt layer having a higher density than the silicon oxide layer and a film thickness of about 381.2 nm, an SH-wave spurious response appears, as indicated by arrow A. Similarly, in the cases of using a W layer having a film thickness of about 194 nm and a Ta layer having a film thickness of about 480 nm, SH-wave spurious responses appear. In contrast, in the case of using Au, Mo, Ag, or Cu, substantially no SH-wave spurious response appears in the impedance characteristics.

Accordingly, one selected from the group consisting of Au, Mo, Ag, and Cu, for example, is preferably used as a metal having a higher density than the silicon oxide layer. In this case, even if the AlCu layer having a volume resistivity of about 15 $\mu\Omega \cdot cm$ is used, the resistance of the interdigital transducer electrode is able to be sufficiently reduced. Furthermore, good resonance characteristics in which substantially no SH-wave spurious response appears are achieved.

While the elastic wave resonators have been described in the foregoing preferred embodiments, preferred embodiments of the present invention are not limited to elastic wave resonators and may be used for elastic wave devices, such as elastic wave filters, having other electrode structures. Also in such a case, the trade-off line between the band width ratio and the temperature characteristics is able to be improved, and an elastic wave device having good band width ratio and good temperature characteristics is able to be provided.

Furthermore, the use of an AlCu alloy mainly including Al reduces the electrical resistance of an interdigital transducer electrode. Thus, frequency variations are not easily increased, and the interdigital transducer electrode has a relatively high corrosion resistance and is easily produced.

Even in the case in which the elastic wave device uses a Love wave, in addition to the case where the elastic wave device uses a Rayleigh wave, the trade-off relationship between the band width ratio and the temperature characteristics is able to be improved.

The elastic wave device according to each of the foregoing preferred embodiments may be used for, for example, a duplexer of a high-frequency front-end circuit. Such a preferred embodiment of the present invention will be described below.

Figure 7:
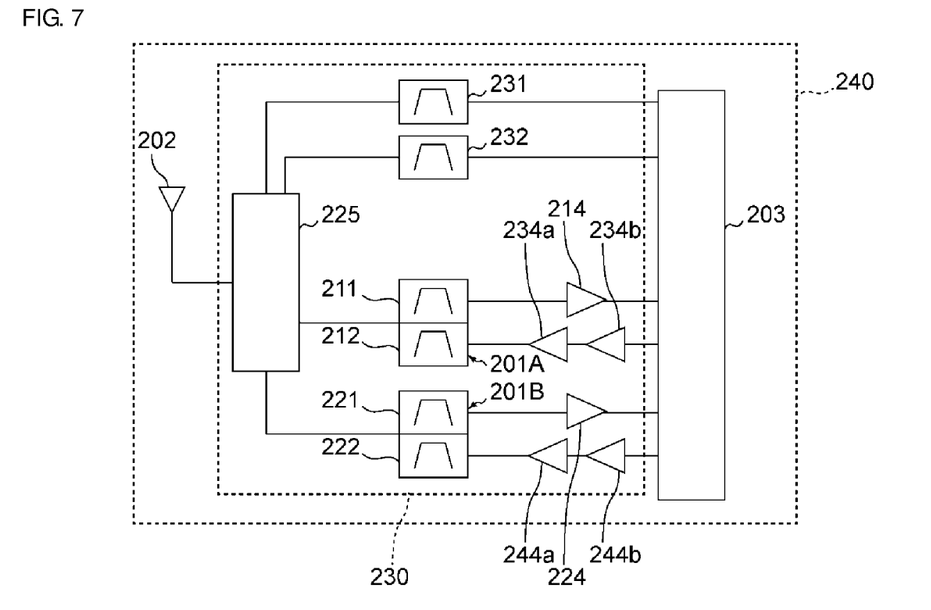
FIG. 7 is a schematic circuit diagram of a communication apparatus including a high-frequency front-end circuit according to a preferred embodiment of the present invention.

FIG. 7 is a schematic diagram of a high-frequency front-end circuit and a communication apparatus according to a preferred embodiment of the present invention. FIG. 7 also illustrates components, such as an antenna element 202 and an RF signal integrated circuit (RFIC) 203, connected to a high-frequency front-end circuit 230. The high-frequency front-end circuit 230 and the RF signal integrated circuit 203 are included in a communication apparatus 240. The communication apparatus 240 may include a power source, a central processing unit (CPU), and a display.

The high-frequency front-end circuit 230 includes a switch 225, duplexers 201A and 201B, filters 231 and 232, low-noise amplifier circuits 214 and 224, and power amplifier circuits 234a, 234b, 244a, and 244b. The high-frequency front-end circuit 230 and the communication apparatus 240 illustrated in FIG. 7 are examples of the high-frequency front-end circuit and the communication apparatus. The high-frequency front-end circuit and the communication apparatus are not limited to the configuration.

The duplexer 201A includes filters 211 and 212. The duplexer 201B includes filters 221 and 222. The duplexers 201A and 201B are connected to the antenna element 202 via the switch 225. The foregoing elastic wave devices according to preferred embodiments of the present invention may be used for the duplexers 201A and 201B or may be used for the filters 211, 212, 221, and 222.

The foregoing elastic wave devices according to preferred embodiments of the present invention may be used for multiplexers each including three or more filters, for example, triplexers each including three filters that share a common antenna terminal and hexaplexers including six filters that share a common antenna terminal.

Examples of the foregoing elastic wave devices according to preferred embodiments of the present invention include elastic wave resonators, filters, duplexers, and multiplexers each including three or more filters. The configuration of each of the multiplexers is not limited to a configuration including both a transmitting filter and a receiving filter. Each multiplexer may have a configuration including only a transmitting filter or only a receiving filter.

The switch 225 connects the antenna element 202 to at least one signal path corresponding to a predetermined band in response to a control signal from a controller (not illustrated), and may include, for example, a single-pole double-throw (SPDT) switch. The at least one signal path connected to the antenna element 202 may be a plurality of signal paths. That is, the high-frequency front-end circuit 230 may support carrier aggregation.

The low-noise amplifier circuit 214 is a reception amplifier circuit that amplifies a high-frequency signal (in this case, a high-frequency received signal) fed thereto via the antenna element 202, the switch 225, and the duplexer 201A and that feeds the amplified signal to the RF signal integrated circuit 203. The low-noise amplifier circuit 224 is a reception amplifier circuit that amplifies a high-frequency signal (in this case, a high-frequency received signal) fed thereto via the antenna element 202, the switch 225, and the duplexer 201B and that feeds the amplified signal to the RF signal integrated circuit 203.

Each of the power amplifier circuits 234a and 234b is a transmission amplifier circuit that amplifies a high-frequency signal supplied from the RF signal integrated circuit 203 (in this case, a high-frequency transmission signal) and that feeds the amplified signal to the antenna element 202 via the duplexers 201A and the switch 225. Each of the power amplifier circuits 244a and 244b is a transmission amplifier circuit that amplifies a high-frequency signal supplied from the RF signal integrated circuit 203 (in this case, a high-frequency transmission signal) and that feeds the amplified signal to the antenna element 202 via the duplexers 201B and the switch 225.

The RF signal integrated circuit 203 allows a high-frequency reception signal supplied from the antenna element 202 through a reception signal path to be subjected to signal processing, such as down-conversion, for example, and feeds a reception signal generated by the signal processing. The RF signal integrated circuit 203 allows a transmission signal fed thereto to be subjected to signal processing such as up-conversion and feeds a high-frequency transmission signal generated by the signal processing to the power amplifier circuits 234a, 234b, 244a, and 244b. The RF signal integrated circuit 203 is preferably, for example, an RFIC. The communication apparatus may preferably include a baseband integrated circuit (BBIC). In this case, the BBIC processes a reception signal that has been processed by the RFIC. The BBIC processes a transmission signal and feeds the processed signal to the RFIC. The reception signal processed by the BBIC and the transmission signal to be processed with the BBIC are preferably, for example, an image signal and an audio signal.

The high-frequency front-end circuit 230 may include duplexers according to a modification of the duplexers 201A and 201B, in place of the duplexers 201A and 201B.

The filters 231 and 232 in the communication apparatus 240 are connected between the RF signal integrated circuit 203 and the switch 225 without the low-noise amplifier circuit 214 or 224 or the power amplifier circuit 234a, 234b, 244a, or 244b. The filters 231 and 232 are also connected to the antenna element 202 via the switch 225, similarly to the duplexers 201A and 201B.

The elastic wave devices, the high-frequency front-end circuits, and the communication apparatuses according to preferred embodiments of the present invention have been described. The present invention includes other preferred embodiments provided by combinations of the elements in the preferred embodiments described above, modifications obtained by various modifications of the foregoing preferred embodiments conceived by those skilled in the art without departing from the gist of the present invention, and various devices including the high-frequency front-end circuit and the communication apparatus according to preferred embodiments of the present invention.

Preferred embodiments of the present invention can be widely used in, for example, communication devices, such as cellular phones, as elastic wave resonators, filters, duplexers, multiplexers that can be used in multiband systems, front-end circuits, and communication apparatuses.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate made of lithium niobate;
   an interdigital transducer electrode on the piezoelectric substrate; and
   a silicon oxide layer on the piezoelectric substrate, the silicon oxide layer covering the interdigital transducer; wherein
   the interdigital transducer electrode includes:
      an AlCu layer; and
      a metal layer disposed closer to the piezoelectric substrate than the AlCu layer, the metal layer having a higher density than the silicon oxide layer; and
   the AlCu layer has a Cu concentration of about 13% by weight or more.

2. The elastic wave device according to claim 1, wherein the AlCu layer has a Cu concentration of about 37% or less by weight.

3. The elastic wave device according to claim 1, wherein a Rayleigh wave is used.

4. The elastic wave device according to claim 1, wherein the metal layer having a higher density than the silicon oxide layer is made of one metal selected from the group consisting of Mo, Cu, Ag, and Au.

5. The elastic wave device according to claim 1, wherein the piezoelectric substrate is a rotated Y-cut X-propagation lithium niobate substrate having Euler angles of about (0°, 37.5°, 0°).

6. The elastic wave device according to claim 1, wherein the silicon oxide layer has a film thickness of about 1,110 nm to about 1,650 nm.

7. A high-frequency front-end circuit comprising:
   the elastic wave device according to claim 1; and
   a power amplifier.

8. The high-frequency front-end circuit according to claim 7, wherein the AlCu layer has a Cu concentration of about 37% or less by weight.

9. The high-frequency front-end circuit according to claim 7, wherein a Rayleigh wave is used.

10. The high-frequency front-end circuit according to claim 7, wherein the metal layer having a higher density than the silicon oxide layer is made of one metal selected from the group consisting of Mo, Cu, Ag, and Au.

11. The high-frequency front-end circuit according to claim 7, wherein the piezoelectric substrate is a rotated Y-cut X-propagation lithium niobate substrate having Euler angles of about (0°, 37.5°, 0°).

12. The high-frequency front-end circuit according to claim 7, wherein the silicon oxide layer has a film thickness of about 1,110 nm to about 1,650 nm.

13. A communication apparatus comprising:
   the high-frequency front-end circuit according to claim 7; and
   an RF signal processing circuit.

14. The communication apparatus according to claim 13, wherein the AlCu layer has a Cu concentration of about 37% or less by weight.

15. The communication apparatus according to claim 13, wherein a Rayleigh wave is used.

16. The communication apparatus according to claim 13, wherein the metal layer having a higher density than the silicon oxide layer is made of one metal selected from the group consisting of Mo, Cu, Ag, and Au.

17. The communication apparatus according to claim 13, wherein the piezoelectric substrate is a rotated Y-cut X-propagation lithium niobate substrate having Euler angles of about (0°, 37.5°, 0°).

18. The communication apparatus according to claim 13, wherein the silicon oxide layer has a film thickness of about 1,110 nm to about 1,650 nm.

* * * * *